United States Patent
Hirao et al.

(10) Patent No.: US 11,956,933 B2
(45) Date of Patent: Apr. 9, 2024

(54) POWER CONVERSION DEVICE AND MOTOR-INTEGRATED POWER CONVERSION DEVICE

(71) Applicant: HITACHI ASTEMO, LTD., Hitachinaka (JP)

(72) Inventors: Takashi Hirao, Tokyo (JP); Takeshi Tokuyama, Tokyo (JP); Noriyuki Maekawa, Hitachinaka (JP); Akira Matsushita, Hitachinaka (JP); Toshiya Satoh, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 201 days.

(21) Appl. No.: 17/760,729

(22) PCT Filed: Jul. 31, 2020

(86) PCT No.: PCT/JP2020/029397
§ 371 (c)(1),
(2) Date: Mar. 15, 2022

(87) PCT Pub. No.: WO2021/053975
PCT Pub. Date: Mar. 25, 2021

(65) Prior Publication Data
US 2022/0338370 A1   Oct. 20, 2022

(30) Foreign Application Priority Data

Sep. 20, 2019  (JP) .................................. 2019-172014

(51) Int. Cl.
*H05K 7/20* (2006.01)
*H02K 9/00* (2006.01)
(Continued)

(52) U.S. Cl.
CPC ............. *H05K 7/2089* (2013.01); *H02K 9/00* (2013.01); *H02M 7/003* (2013.01); *H02M 7/537* (2013.01)

(58) Field of Classification Search
CPC .. H05K 7/20845–20945; H02M 7/003; H02M 7/537
See application file for complete search history.

(56) References Cited

U.S. PATENT DOCUMENTS 9,263,356 B2 * 2/2016 Miyamoto ............ H01L 25/115
9,881,019 B2 * 1/2018 Matsuo ............... G06F 16/1748
(Continued)

FOREIGN PATENT DOCUMENTS

JP    2010-166700 A    7/2010
JP    2010-252460 A    11/2010
(Continued)

OTHER PUBLICATIONS

International Search Report with English translation and Written Opinion issued in corresponding application No. PCT/JP2020/029397 dated Oct. 27, 2020.

*Primary Examiner* — Robert J Hoffberg
(74) *Attorney, Agent, or Firm* — Foley & Lardner LLP (57) ABSTRACT

No consideration is given to heat transferred from a semiconductor module to a capacitor via a bus bar module. The heat generated by a semiconductor module (1) is transferred to a bus bar module (3) via a DC terminal (1A) of the semiconductor module (1). As illustrated in FIG. 4(B), the heat transferred to the bus bar module 3 is then transferred to the pressing member 5 via the annular conductor 8 and the bolt 5A. Since the pressing member 5 is in close contact with the second cooler 2B, the heat transferred to the pressing member 5 is cooled by the second cooler 2B. On the other hand, the heat transferred to the convex portion 6A of the housing 6 is transferred to the first cooler 2A via the housing (Continued)

6 and cooled. As a result, in the configuration in which a capacitor (4) is connected to the semiconductor module (1) via the bus bar module (3), the heat transferred from the semiconductor module (1) to the capacitor (4) can be suppressed.

8 Claims, 9 Drawing Sheets

(51) Int. Cl.
     *H02M 7/00*          (2006.01)
     *H02M 7/537*      (2006.01)

(56) References Cited

U.S. PATENT DOCUMENTS

| | | | |
|---|---|---|---|
| 10,070,565 B2 * | 9/2018 | Mizuno | H05K 7/20927 |
| 10,361,608 B2 * | 7/2019 | Hasegawa | H02K 5/203 |
| 11,757,325 B2 * | 9/2023 | Morika | H05K 7/20927 |
| | | | 310/54 |
| 2023/0135773 A1 * | 5/2023 | Hirao | H02M 7/003 |
| | | | 363/13 |

FOREIGN PATENT DOCUMENTS

| | | |
|---|---|---|
| JP | 2015-128138 A | 7/2015 |
| JP | 2015-201957 A | 11/2015 |

\* cited by examiner

POWER CONVERSION DEVICE AND MOTOR-INTEGRATED POWER CONVERSION DEVICE

TECHNICAL FIELD

The present invention relates to a power conversion device and a motor-integrated power conversion device.

BACKGROUND ART

A power conversion device such as an inverter or a converter performs power conversion between DC power and AC power by the switching operations of a plurality of semiconductor elements. In such a power conversion device, a capacitor that smooths the current supplied from a DC power supply to a semiconductor module is electrically connected to the semiconductor module via a bus bar module. Due to downsizing of the power conversion device, the semiconductor module and the capacitor are close to each other, and heat is conducted from the semiconductor module to the capacitor via the bus bar.

PTL 1 discloses a power conversion device in which a semiconductor terminal of a semiconductor module and a capacitor terminal of a capacitor are brought into direct contact with each other and are brought into thermal contact with a cooler.

CITATION LIST

Patent Literature

PTL 1: JP 2010-252460 A

SUMMARY OF INVENTION

Technical Problem

In the device described in PTL 1, heat transferred from the semiconductor module to the capacitor via the bus bar module is not considered.

Solution to Problem

A power conversion device according to the present invention includes: a semiconductor module incorporating a semiconductor element; a cooler that cools the semiconductor module; a pressing member that presses the cooler against the semiconductor module; a bus bar module in which a bus bar that electrically connects the semiconductor module and a capacitor is sealed with an insulating member; and a housing that houses the semiconductor module, the cooler, and the bus bar module, in which a part of the bus bar module is in contact with the pressing member and a part of the housing.

Advantageous Effects of Invention

According to the present invention, it is possible to suppress the heat transferred from the semiconductor module to the capacitor via the bus bar module.

DESCRIPTION OF EMBODIMENTS

Embodiments of the present invention will be described below with reference to the accompanying drawings. The following description and drawings are examples for describing the present invention, and are simplified and with omissions, as appropriate, for the sake of clarity of description. The present invention can be carried out in various other forms. Unless otherwise specified, each component may be singular or plural.

Some of positions, sizes, shapes, ranges, and the like of the components illustrated in the drawings may not represent actual positions, sizes, shapes, ranges, and the like, for the sake of facilitating understanding of the invention. Therefore, the present invention is not necessarily limited to the positions, sizes, shapes, ranges, and the like disclosed in the drawings.

First Embodiment

Figure 1:
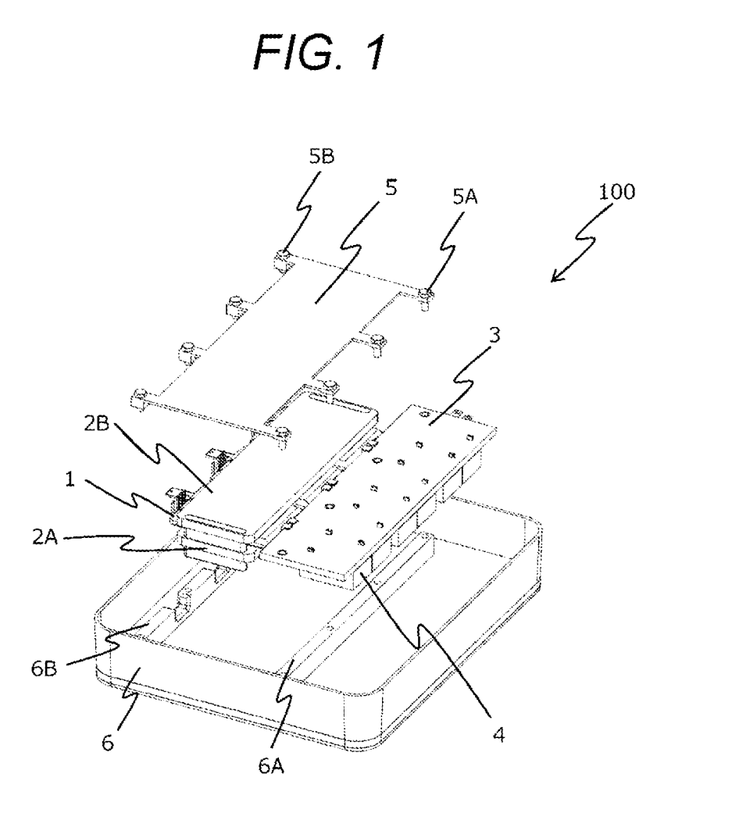
FIG. 1 is an exploded perspective view of a power conversion device according to a first embodiment.

A power conversion device 100 according to the first embodiment will be described with reference to FIGS. 1 to 4. FIG. 1 is an exploded perspective view of the power conversion device 100 according to the present embodiment. As illustrated in FIG. 1, a first cooler 2A is in contact with one surface of a semiconductor module 1, and a second cooler 2B is in contact with the other surface of the semiconductor module 1. The semiconductor module 1 incorporates a semiconductor element such as an IGBT using silicon (Si, silicon) as a base material or a MOSFET using silicon carbide (SiC) as a base material. The first cooler 2A and the second cooler 2B each form a path through which a cooling fluid (e.g. long life coolant) flows and are made of aluminum or resin. The first cooler 2A and the second cooler 2B disposed on both surfaces of the semiconductor module 1 cool the semiconductor module 1 that has generated heat by the switching operation of the semiconductor element.

A terminal of the semiconductor module 1 is connected to the terminal connected to a bus bar in a bus bar module 3. The bus bar module 3 is a module in which a bus bar is sealed with an insulating member.

The bus bar is a plate-like conductor for electric wiring, and copper or aluminum is used for the bus bar. In the present embodiment, the bus bar is used for electrical connection between the semiconductor module 1 and a capacitor 4. The insulating member is a member such as a resin that insulates bus bars having different potentials from each other.

The capacitor 4 is adjacent to the semiconductor module 1 and is installed below the bus bar module 3 in FIG. 1. The capacitor 4 is a member for smoothing voltage ripples caused by switching of the semiconductor element. A film capacitor or an electrolytic capacitor is used as the capacitor 4.

A pressing member 5 is provided on the surface (upper surface in FIG. 1) of the second cooler 2B opposite to the surface in contact with the semiconductor module 1 so as to cover the second cooler 2B. The pressing member 5 is a member for pressing and fixing the semiconductor module 1 the first cooler 2A, and the second cooler 2B against a housing 6, and is made of aluminum, iron, or the like. In the pressing member 5, a total of eight protruding portions integrally formed with the pressing member 5 are formed on the bus bar module 3 side and the opposite side. The pressing member 5 is fixed to a part of the housing 6 by bolts 5A and 5B at the protruding portions.

The housing 6 houses the semiconductor module 1, the first cooler 2A, the second cooler 2B, the bus bar module 3, the capacitor 4, and the pressing member 5. Convex portions 6A and 6B are provided at the bottom of the housing 6 as alignment of the components to be stored and receiving portions of the bolts 5A and 5B. The convex portions 6A and 6B may be provided integrally with the housing 6 or may be provided separately, and form a part of the housing 6 in either case. The material of the housing 6 and the convex portions 6A and 6B is aluminum having high thermal conductivity.

Figure 2:
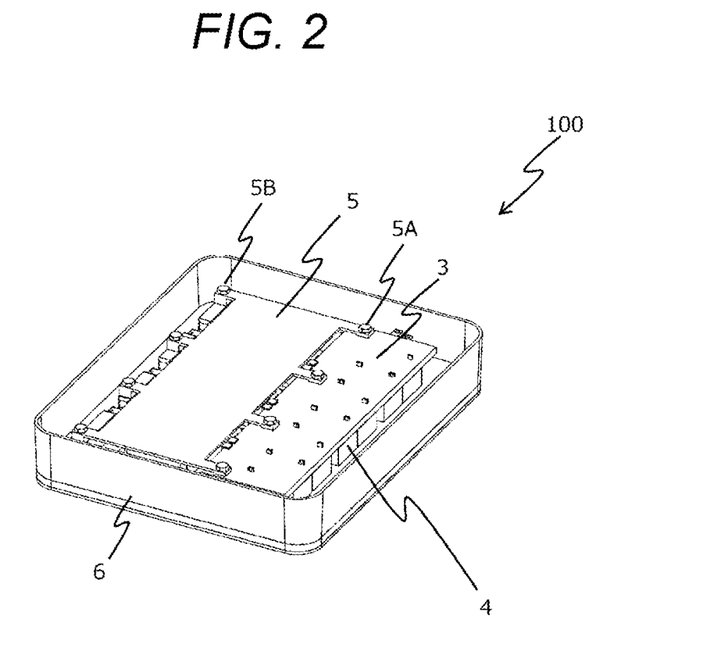
FIG. 2 is a perspective view of the power conversion device according to the first embodiment.

FIG. 2 is a perspective view of the power conversion device 100 according to the present embodiment.

As illustrated in FIG. 2, the housing 6 houses the semiconductor module 1, the first cooler 2A, the second cooler 2B, the bus bar module 3, the capacitor 4, and the pressing member 5. The housing 6 is provided with a lid that covers the upper portion of the housing 6, but is not illustrated.

The power conversion device 100 mutually converts DC power and AC power by the switching operations of a plurality of semiconductor elements in the semiconductor module 1 and operation of the capacitor 4 or the like that smooths voltage ripples accompanying switching of the semiconductor elements.

Figure 3:
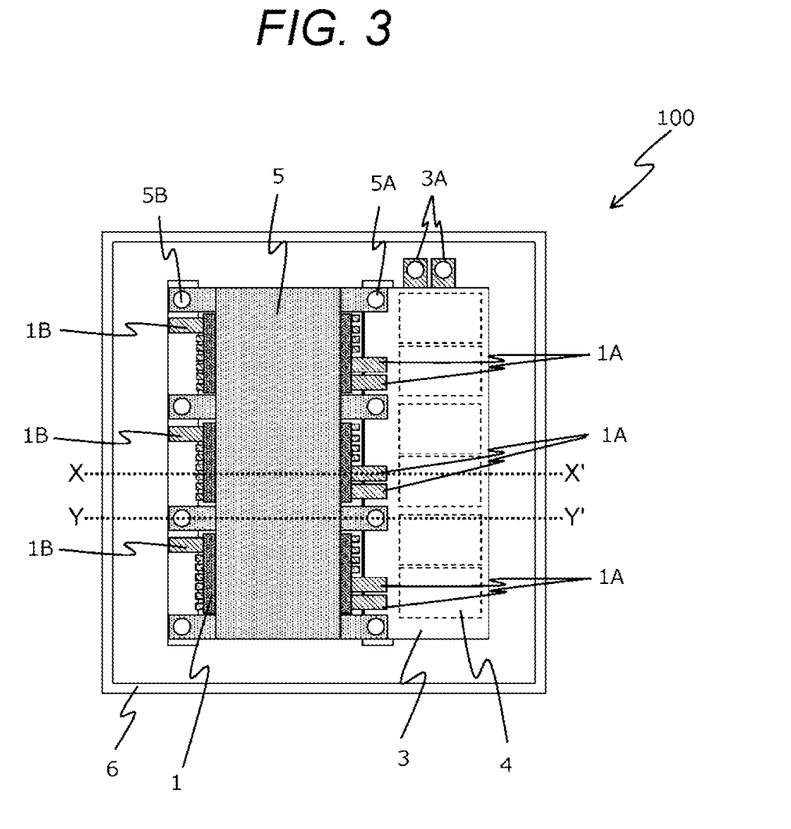
FIG. 3 is a top view of the power conversion device according to the first embodiment.

FIG. 3 is a to view of the power conversion device 100 according to the present embodiment. The same portions as those in FIG. 1 are denoted by the same reference numerals, and a description of them will be omitted.

In the present embodiment, three semiconductor modules 1 are included. Each of the semiconductor modules includes two DC terminals 1A and one AC terminal 1B. The two DC terminals 1A are respectively connected to a negative electrode bus bar and a positive electrode bus bar in the bus bar module 3 and are further connected to the capacitor 4 via the respective bus bars. The AC terminal 1B is connected to a motor provided outside the power conversion device 100. The power supply terminals 3A led out from the positive and negative bus bars are connected to a DC power supply provided outside the power conversion device 100.

FIG. 4(A) is a cross-sectional view of the power conversion device 100 and is a cross section taken along line X-X' illustrated in FIG. 3. FIG. 4(B) is a cross-sectional view of the power conversion device 100 and is a cross section taken along line Y-Y' illustrated in FIG. 3.

As illustrated in FIG. 4(A), the DC terminal 1A of the semiconductor module 1 is connected to a bus bar 31 in the bus bar module 3. An insulating member 32 in the bus bar module 3 insulates the bus bars 31 having different potentials.

As illustrated in FIG. 4(B), the pressing member 5 is fixed to the convex portions 6A and 6B of the housing 6 by bolts 5A and 5B. Accordingly, the pressing member 5 presses the second cooler 2B, the semiconductor module 1, and the first cooler 2A against the housing 6. Further, the pressing member 5 sandwiches the bus bar module 3 between the pressing member 5 and the convex portion 6A of the housing 6. That is, a part of the bus bar module 3 is sandwiched between a part of the housing 6 and the pressing member. An annular conductor 8 is disposed around the bolt 5A in the sandwiched bus bar module 3. Although an example in which a part of the bus bar module 3 is sandwiched between a part of the housing 6 and the pressing member 5 has been described, it is sufficient that a part of the bus bar module 3 is in contact with a part of the housing 6 and the pressing member 5. For example, the bus bar module 3 and the pressing member 5 are arranged side by side in the same plane, and an end surface 3E of the bus bar module 3 and an end surface 5E of the pressing member 5 are brought into contact with each other. The bus bar module 3 and the pressing member 5 are then fixed to the convex portion 6A of the housing 6 with the bolt 5A.

The heat generated by the semiconductor module 1 is cooled by the first cooler 2A and the second cooler 2B as illustrated in FIG. 4(A). Further, the heat generated by the semiconductor module 1 is transferred to the bus bar module 3 via the DC terminal 1A of the semiconductor module 1. As illustrated in FIG. 4(B), the heat transferred to the bus bar module 3 is then transferred to the pressing member 5 via the annular conductor 8 and the bolt 5A. The annular conductor 8 is a conductor that is built in the bus bar module 3 and receives the bolt 5A. The material of the annular conductor 8 is copper or aluminum. Providing the annular conductor 8 makes it possible to reduce the thermal resistance of the bolt fastening portion and hence to improve the heat dissipation property. Since the pressing member 5 is in close contact with the second cooler 2B, the heat transferred to the pressing member 5 is cooled by the second cooler 2B. On the other hand, the heat transferred to the convex portion 6A of the housing 6 is transferred to the first cooler 2A via the housing 6 and cooled.

As a result, in the configuration in which the capacitor 4 is connected to the semiconductor module 1 via the bus bar module 3, the heat transferred from the semiconductor module 1 to the capacitor 4 via the bus bar module 3 can be suppressed.

Second Embodiment

A power conversion device 200 according to the second embodiment will be described with reference to FIGS. 5 and 6.

Figure 5:
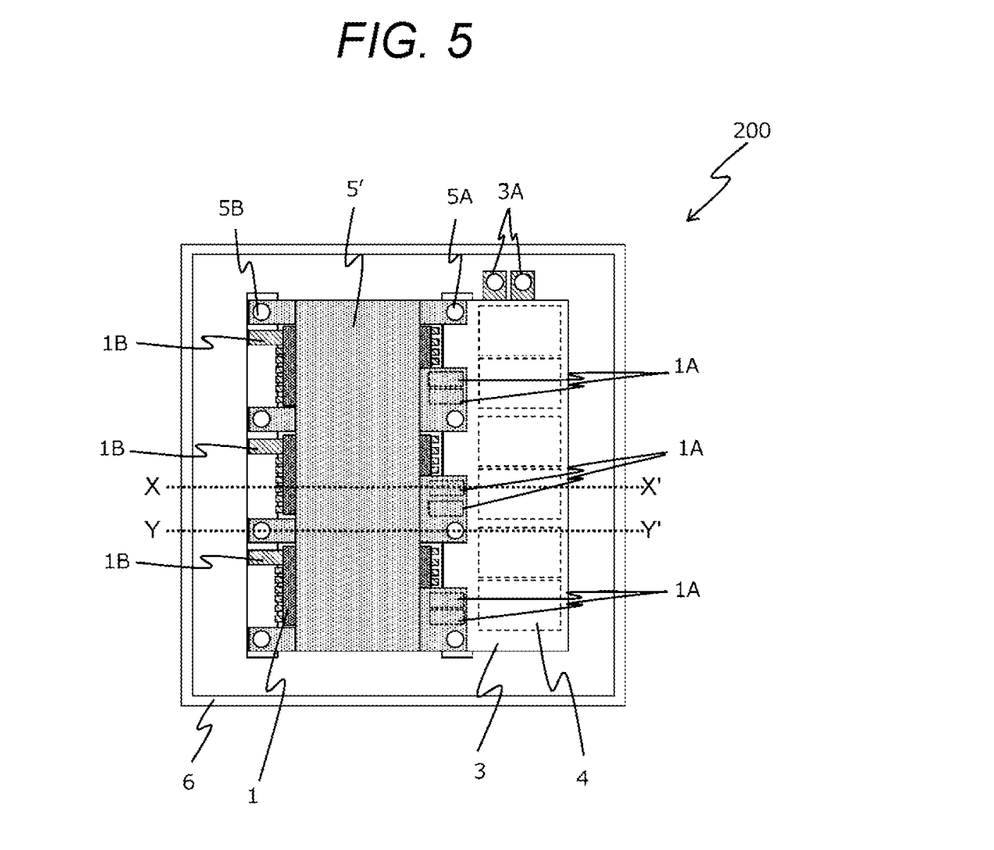
FIG. 5 is a top view of a power conversion device according to a second embodiment.
Figure 6:
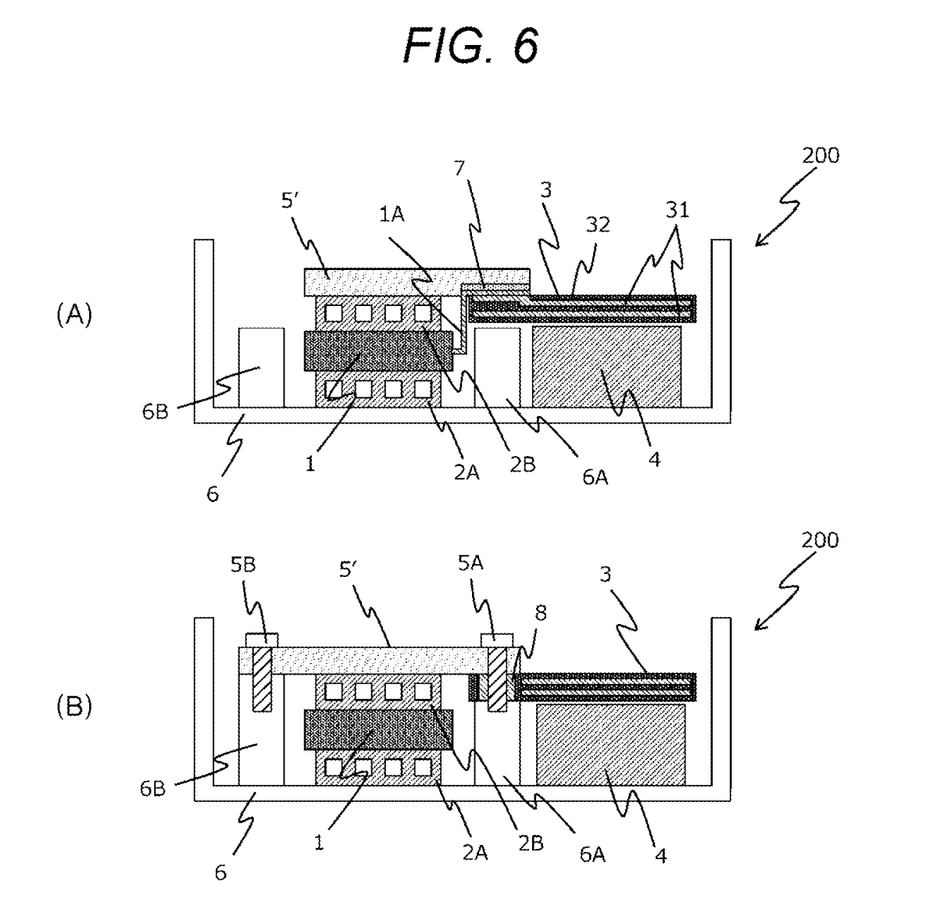
FIGS. 6(A) and 6(B) are cross-sectional views of the power conversion device according to the second embodiment.

FIG. 5 is a to view of the power conversion device 200 according to the present embodiment. The same portions as those of the power conversion device 100 according to the first embodiment illustrated in FIG. 3 are denoted by the same reference numerals, and a description of them will be omitted.

In the present embodiment, as illustrated in FIG. 5, the shape of a pressing member 5' is different from that of the first embodiment, and a pressing member 5' is formed to cover a DC terminal 1A.

FIG. 6(A) is a cross-sectional view of the power conversion device 200 and is a cross section taken along line X-X' illustrated in FIG. 5. FIG. 6(B) is a cross-sectional view of the power conversion device 200 and is a cross section taken along line Y-Y' illustrated in FIG. 5. The same portions as those of the power conversion device 100 according to the first embodiment illustrated in FIGS. 4(A) and 4(B) are denoted by the same reference numerals, and a description of them will be omitted.

As illustrated in FIG. 6(A), the pressing member 5' is formed in a shape covering the DC terminal 1A and is in contact with the DC terminal 1A and a bus bar module 3 via an insulating sheet 7. The insulation sheet 7 is a heat conductive sheet having an electrical insulation function.

As illustrated in FIG. 6(B), the pressing member 5 is fixed to convex portions 6A and 6B of a housing 6 with bolts 5A and 5B. An annular conductor 8 is disposed around the bolt 5A.

The heat generated by the semiconductor module 1 is cooled by a first cooler 2A and a second cooler 2B as illustrated in FIG. 6(A). Further, the heat generated by the semiconductor module 1 is transferred to the bus bar module 3 and the insulating sheet 7 via the DC terminal 1A of the semiconductor module 1.

The heat transferred to the insulating sheet 7 is transferred to the second cooler 2B via the pressing member 5' and cooled here. As illustrated in FIG. 5(B), the heat transferred to the bus bar module 3 is transferred to the pressing member 5' via the annular conductor 8 and the bolt 5A and cooled by the second cooler 2B. On the other hand, the heat transferred to the convex portion 6A of the housing 6 is transferred to the first cooler 2A via the housing 6 and cooled.

As a result, in the configuration in which the capacitor 4 is connected to the semiconductor module 1 via the bus bar module 3, the heat transferred from the semiconductor module 1 to the capacitor 4 via the bus bar module 3 can be suppressed more efficiently.

Third Embodiment

A power conversion device 300 according to the third embodiment will be described with reference to FIG. 7.

Figure 4:
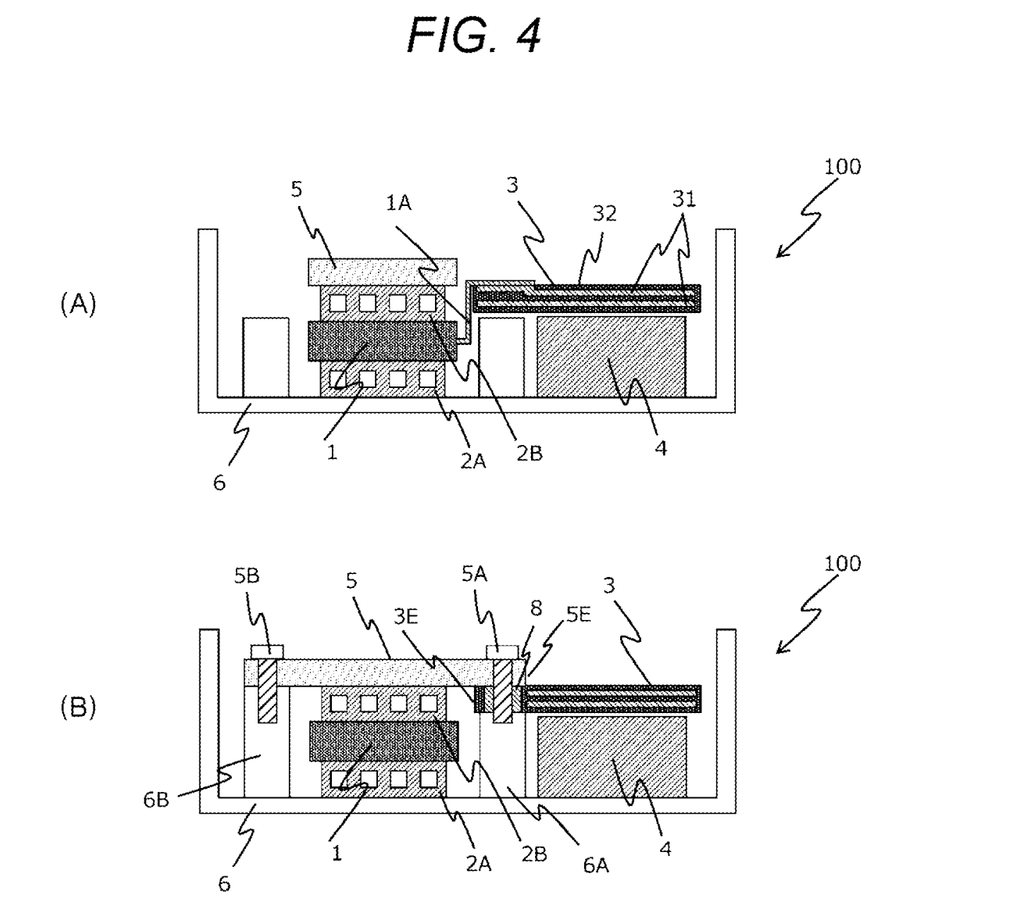
FIGS. 4(A) and 4(B) are cross-sectional views of the power conversion device according to the first embodiment.
Figure 7:
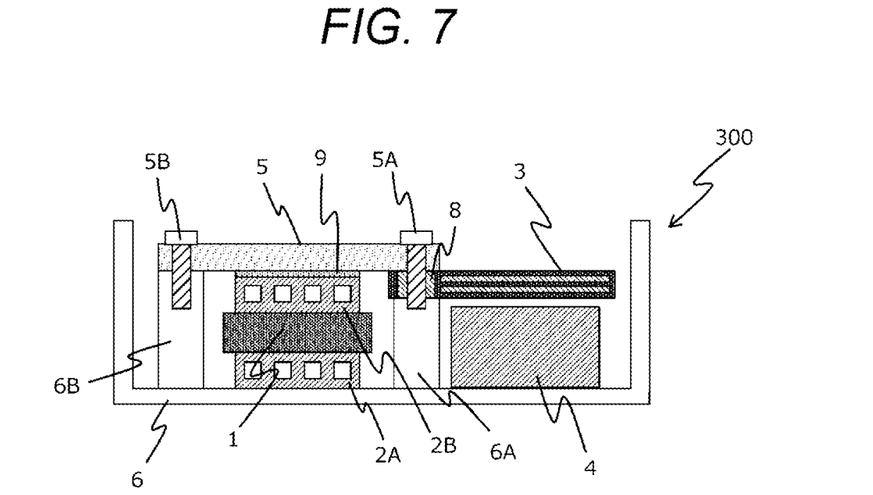
FIG. 7 is a cross-sectional view of a power conversion device according to a third embodiment.

FIG. 7 is a cross-sectional view of the power conversion device 300 according to the present embodiment and corresponds to a cross section taken along line Y-Y' illustrated in FIG. 3. The same portions as those of the power conversion device 100 according to the first embodiment illustrated in FIG. 4 are denoted by the same reference numerals, and a description of them will be omitted.

In the present embodiment, as illustrated in FIG. 7, a heat conductive material 9 is provided between a pressing member 5 and a second cooler 2B. The heat conductive material 9 is, for example, grease or a heat dissipation sheet. The heat conductive material 9 reduces the contact heat resistance between the pressing member 5 and the second cooler 2B. As a result, the heat transferred from a bus bar module 3 to the pressing member 5 is more efficiently cooled by the second cooler 2B. Note that the present embodiment can be applied not only to the first embodiment but also to the second embodiment.

Fourth Embodiment

A motor-integrated power conversion device 800 according to the fourth embodiment will be described with reference to FIG. 8.

Figure 8:
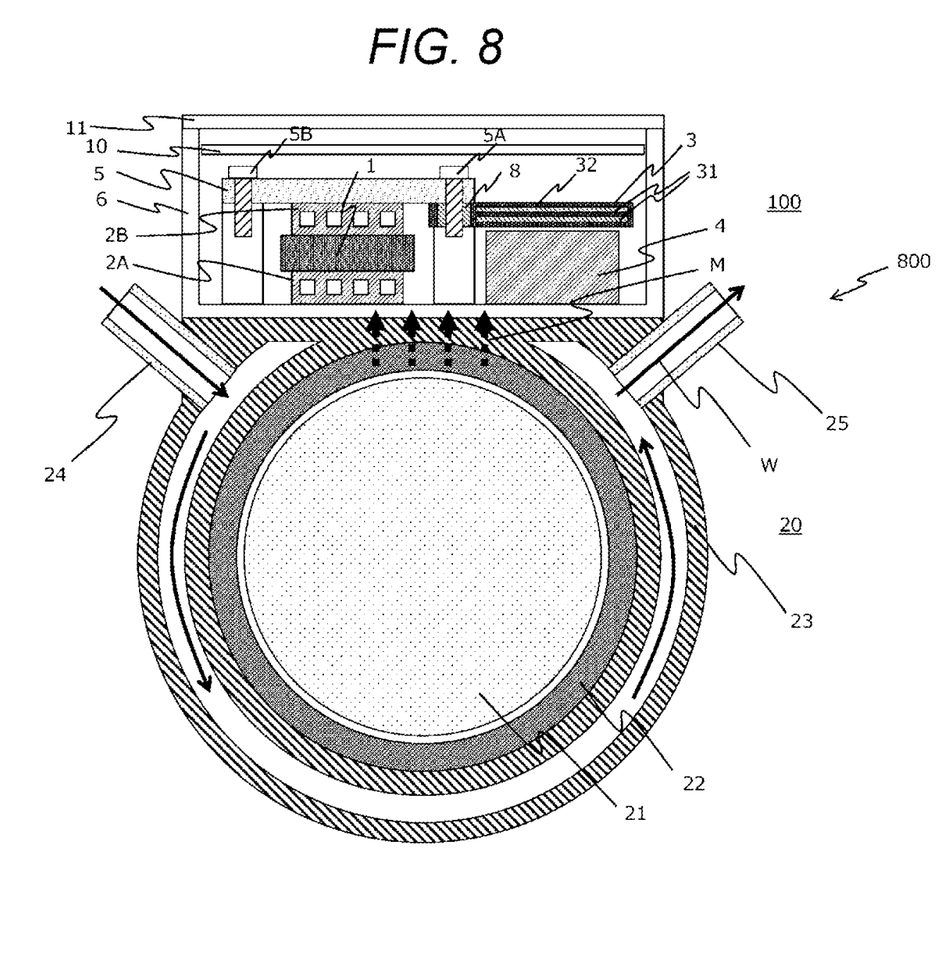
FIG. 8 is a cross-sectional view of a motor-integrated power conversion device according to a fourth embodiment.

FIG. 8 is a cross-sectional view of the motor-integrated power conversion device 800. As illustrated in FIG. 8, the motor-integrated power conversion device 800 is configured such that a power conversion device 100 is integrated with a motor 20. Note that the power conversion device 100 illustrated in FIG. 8 corresponds to a cross section taken along line Y-Y' illustrated in FIG. 3. The same portions as those of the power conversion device 100 according to the first embodiment illustrated in FIG. 4 are denoted by the same reference numerals, and a description of them will be omitted.

The motor-integrated power conversion device 800 includes the power conversion device 100 and the motor 20 that is configured integrally with the power conversion device 100 and disposed, on the opposite side to a pressing member 5, so as to sandwich a bus bar module 3, a first cooler 2A, and a second cooler 2B with the pressing member 5. The power conversion device 100 converts a DC power supply into three-phase AC power to drive the motor 20.

The motor 20 includes a rotor 21, a stator 22, a motor housing 23, an inlet pipe 24 for a refrigerant W, and an outlet pipe 25 for the refrigerant W.

When a current flows through the stator 22 to drive the motor 20, the stator 22 generates heat. The stator 22 is cooled by the refrigerant W flowing through the motor housing 23. The flow path in the motor housing 23 near the power conversion device 100 is interrupted in order to keep the height of the entire device low. Accordingly, there is a possibility that the heat generated by the stator 22 is transferred to the housing 6 of the power conversion device 100. In this case, the path for dissipating heat from the bus bar module 3 to the first cooler 2A on the motor 20 side overlaps the heat transfer path M from the stator 22, resulting in difficulty in dissipating heat. However, in the present embodiment, since the heat dissipation path from the bus bar module 3 is secured also in the second cooler 2B on the opposite side of the semiconductor module 1 to the motor 20, heat dissipation can be sufficiently achieved for the bus bar module 3. That is, even in the motor-integrated power conversion device 800, it is possible to sufficiently dissipate heat from the bus bar module 3, and it is possible to more efficiently suppress heat transferred to the capacitor 4.

Although the power conversion device 100 described in the first embodiment has been exemplified in the present embodiment, not only the power conversion device in the first embodiment but also the power conversion device 200 described in the second embodiment or the power conversion device 300 described in the third embodiment may be used.

Fifth Embodiment

A motor-integrated power conversion device 900 according to the fifth embodiment will be described with reference to FIG. 9.

Figure 9:
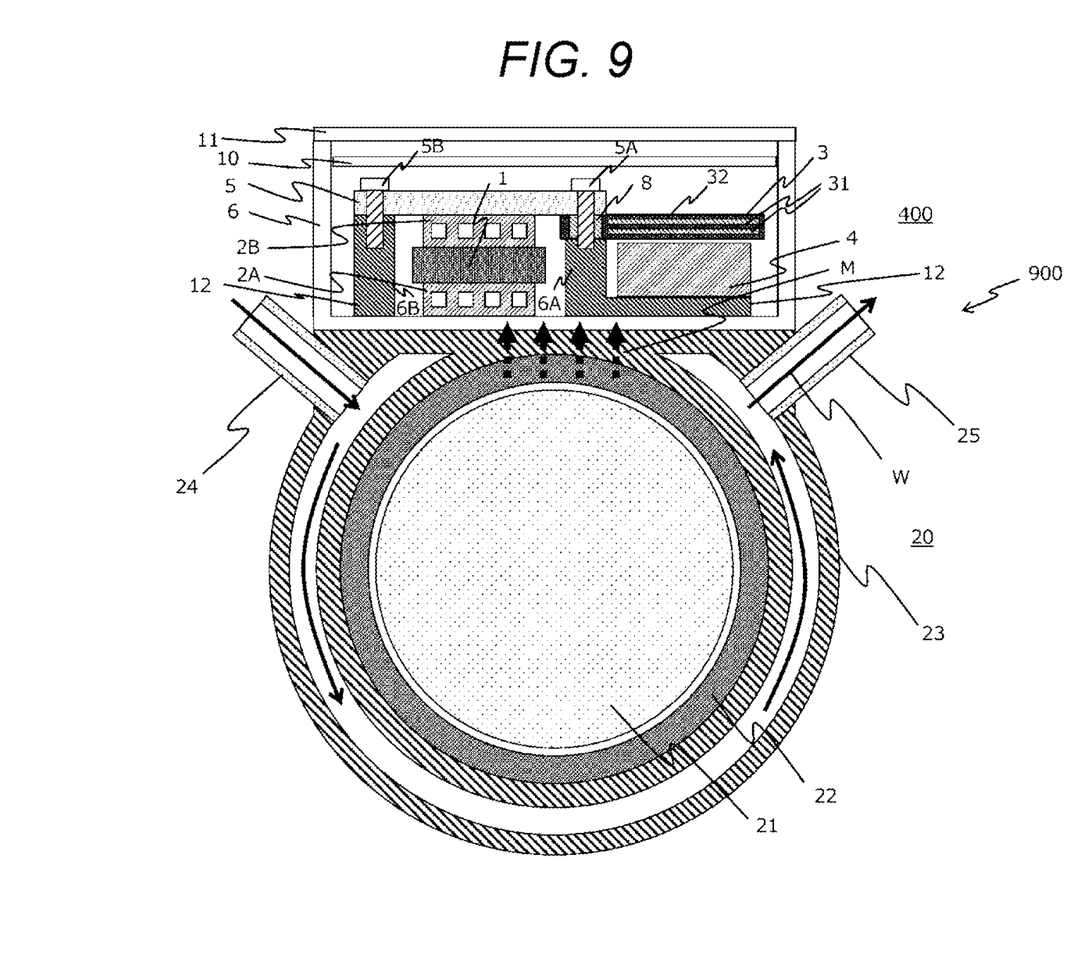
FIG. 9 is a cross-sectional view of a motor-integrated power conversion device according to a fifth embodiment.

FIG. 9 is a cross-sectional view of the motor-integrated power conversion device 900. As illustrated in FIG. 9, in the motor-integrated power conversion device 900 is configured such that a power conversion device 400 is integrated with a motor 20. Note that the power conversion device 400 illustrated in FIG. 9 corresponds to a cross section taken along line Y-Y' illustrated in FIG. 3. The same portions as those of the power conversion device 100 according to the first embodiment illustrated in FIG. 4 are denoted by the same reference numerals, and a description of them will be omitted.

As illustrated in FIG. 9, the power conversion device 400 is configured such that a heat insulating member 12 is disposed between a capacitor 4 and a housing 6, and convex portions 6A and 6B of the housing 6 to which a pressing member 5 is attached with bolts 5A and 5B are formed from the heat insulating member 12. Other configurations are similar to those of the power conversion device 100. The power conversion device 200 described in the second embodiment and the power conversion device 300 described in the third embodiment each may be provided with the heat insulating member 12 similar to that described in the power conversion device 400.

The motor 20 has the same configuration as that described in the fourth embodiment. The same portions are denoted by the same reference numerals, and the description of them will be omitted.

When the thermal resistance of the heat transfer path from a bus bar module 3 to a first cooler 2A is small, the heat received by the bus bar module 3 is easily dissipated to the first cooler 2A. On the other hand, the bus module 3 is easily affected by the heat generated by a stator 22. Accordingly, in the present embodiment, the thermal resistance between the first cooler 2A and the bus bar module 3 is made larger than the thermal resistance between a second cooler 2B and the bus bar module 3. As a result, the heat received by the bus bar module 3 is mainly dissipated to a second cooler 2B. This makes it possible to further reduce the temperature of the bus bar module 3 in the motor-integrated power conversion device 900.

Disposing the heat insulating member 12 in the heat transfer path of the bus bar module 3 from the stator 22 will increase the thermal resistance of the path. The material of the heat insulating member 12 is a resin or the like.

Furthermore, it is possible to suppress the transfer of heat from the stator 22 to the bus bar module 3 via the pressing member 5 by providing the heat insulating member 12 between the pressing member 5 and the housing 6 of the power conversion device 400, more specifically, by forming the convex portions 6A and 6B of the housing 6 to which the pressing member 5 is attached with the bolts 5A and 5B by using the heat insulating member 12.

Furthermore, providing the heat insulating member 12 between the motor 20 and the capacitor 4 can suppress heat conduction from the stator 22 to the capacitor 4.

According to the embodiment described above, the following operational effects can be obtained.

(1) Each of the power conversion devices 100, 200, 300, and 400 includes the semiconductor module 1 incorporating the semiconductor element, the coolers 2A and 2B that cool the semiconductor module 1, the pressing members 5 and 5' that press the coolers 2A and 2B against the semiconductor module 1, the bus bar module 3 in which the bus bar 31 that electrically connects the semiconductor module 1 and the capacitor 4 is sealed with the insulating member 32, and the housing 6 that houses the semiconductor module 1, the coolers 2A and 2B, and the bus bar module 3. A part of the bus bar module 3 is in contact with a part of the housing 6 and the pressing members 5 and 5'. This makes it possible to suppress the heat transferred from the semiconductor module to the capacitor via the bus bar module.

The present invention is not limited to the above embodiments, and other forms conceivable within the scope of the technical idea of the present invention are also included within the scope of the present invention as long as the features of the present invention are not impaired. In addition, the above-described embodiments may be combined.

REFERENCE SIGNS LIST 1 semiconductor module
1A DC terminal
1B AC terminal
2A first cooler
2B second cooler
3 bus bar module
3A power supply terminal
4 capacitor
5, 5' pressing member
5A, 5B bolt
6 housing
6A, 6B convex portion
7 insulating sheet
8 annular conductor
9 heat conductive material
20 motor
21 rotor
22 stator
23 motor housing
24 inlet pipe
25 outlet pipe
31 bus bar
32 insulating member
100, 200, 300, 400 power conversion device

The invention claimed is:

1. A power conversion device comprising:
a semiconductor module incorporating a semiconductor element;
a cooler that cools the semiconductor module;
a pressing member that presses the cooler against the semiconductor module;
a bus bar module in which a bus bar that electrically connects the semiconductor module and a capacitor is sealed with an insulating member; and
a housing that houses the semiconductor module, the cooler, and the bus bar module,
wherein a part of the bus bar module is in contact with the pressing member and a part of the housing.

2. The power conversion device according to claim 1, wherein a part of the bus bar module is sandwiched between a part of the housing and the pressing member.

3. The power conversion device according to claim 1, wherein the pressing member is in contact with a main terminal of the semiconductor module via an insulating sheet.

4. The power conversion device according to claim 1, wherein the cooler includes a first cooler disposed between the semiconductor module and the housing and a second cooler disposed between the pressing member and the semiconductor module.

5. The power conversion device according to claim 4, wherein a heat conductive material is provided between the second cooler and the pressing member.

6. A motor-integrated power conversion device comprising:
the power conversion device according to claim 1; and
a motor configured integrally with the power conversion device and disposed, on an opposite side to the pressing member, so as to sandwich the bus bar module and the cooler with the pressing member.

7. The motor-integrated power conversion device according to claim 6, wherein the cooler includes a first cooler disposed between the semiconductor module and the motor and a second cooler disposed between the pressing member and the semiconductor module.

8. The motor-integrated power conversion device according to claim 7, wherein a thermal resistance between the first cooler and the bus bar module is larger than a thermal resistance between the second cooler and the bus bar module.

* * * * *